(12) United States Patent
RamachandraRao et al.

(10) Patent No.: US 7,335,586 B2
(45) Date of Patent: Feb. 26, 2008

(54) SEALING POROUS DIELECTRIC MATERIAL USING PLASMA-INDUCED SURFACE POLYMERIZATION

(75) Inventors: Vijayakumar S. RamachandraRao, Hillsboro, OR (US); Boyan Boyanov, Portland, OR (US); Grant Kloster, Lake Oswego, OR (US); Hyun-Mog Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 418 days.

(21) Appl. No.: 11/150,498

(22) Filed: Jun. 10, 2005

(65) Prior Publication Data

US 2006/0281329 A1    Dec. 14, 2006

(51) Int. Cl.
*H01L 21/4763* (2006.01)
(52) U.S. Cl. ............... 438/637; 438/689; 438/778; 438/677; 438/788; 438/781; 257/E21.151
(58) Field of Classification Search ........... 438/637, 438/689, 778, 677, 788, 781; 257/E21.151
See application file for complete search history.

(56) References Cited

U.S. PATENT DOCUMENTS 7,005,390 B2   2/2006 RamachandraRao et al.

2003/0001282 A1*  1/2003 Meynen et al. .......... 257/777
2005/0020074 A1   1/2005 Kloster et al.
2005/0077597 A1*  4/2005 Toma et al. ............. 257/629
2005/0129926 A1   6/2005 Kloster et al.
2006/0172531 A1*  8/2006 Lin et al. ................ 438/637

OTHER PUBLICATIONS

Jezewski et al., Molecular Caulking, A Pore Sealing CVD Polymer for Ultralow k Dielectrics, Journal of the Electrochemical Society, 151 (7) May 20, 2004, pp. F157-F161.

* cited by examiner

*Primary Examiner*—Asok K. Sarkar
*Assistant Examiner*—Victor V. Yevsikov (57) ABSTRACT

A method for sealing a porous dielectric layer atop a substrate, wherein the dielectric layer is patterned to form at least a trench and at least a via, comprises applying a first plasma to a surface of the dielectric layer to silanolize the surface, treating the surface of the dielectric layer with a silazane to form a monolayer of silane molecules on the surface, and applying a second plasma to the surface of the dielectric layer to induce a polymerization of at least a portion of the silane molecules. The polymerized silane molecules form a cross-linked matrix that builds over a substantial portion of the surface of the dielectric layer and seals at least some of the exposed pores.

33 Claims, 8 Drawing Sheets

SEALING POROUS DIELECTRIC MATERIAL USING PLASMA-INDUCED SURFACE POLYMERIZATION

BACKGROUND

Modern integrated circuits generally contain several layers of interconnect structures fabricated above a substrate. The substrate may have active devices and/or conductors that are connected by the interconnect structure.

Interconnect structures, typically comprising trenches and vias, are usually fabricated in, or on, an interlayer dielectric (ILD). It is generally accepted that, the dielectric material in each ILD should have a low dielectric constant (k) to obtain low capacitance between conductors. Decreasing this capacitance between conductors, by using a low dielectric constant, results in several advantages. For instance, it provides reduced RC delay, reduced power dissipation, and reduced cross-talk between the metal lines.

To obtain the desired low dielectric constant, porosity is often introduced into the dielectric material. These pores typically increase problems that inherently exist when further processing is done on dielectric material. For example copper formed in the trenches and vias, without a barrier, may diffuse into an underlying layer causing the shorting of adjacent copper lines or line-to-line leakage. Moreover, when vias and trenches are etched in the porous dielectric material, pores are often exposed on the surface of the dielectric. Therefore, interconnect structures employ a barrier layer over the surface of the dielectric to protect from copper diffusing into the dielectric material. Common materials used for this barrier layer are tantalum, tantalum nitride, tantalum carbide, and titanium nitride.

Figure 1A:
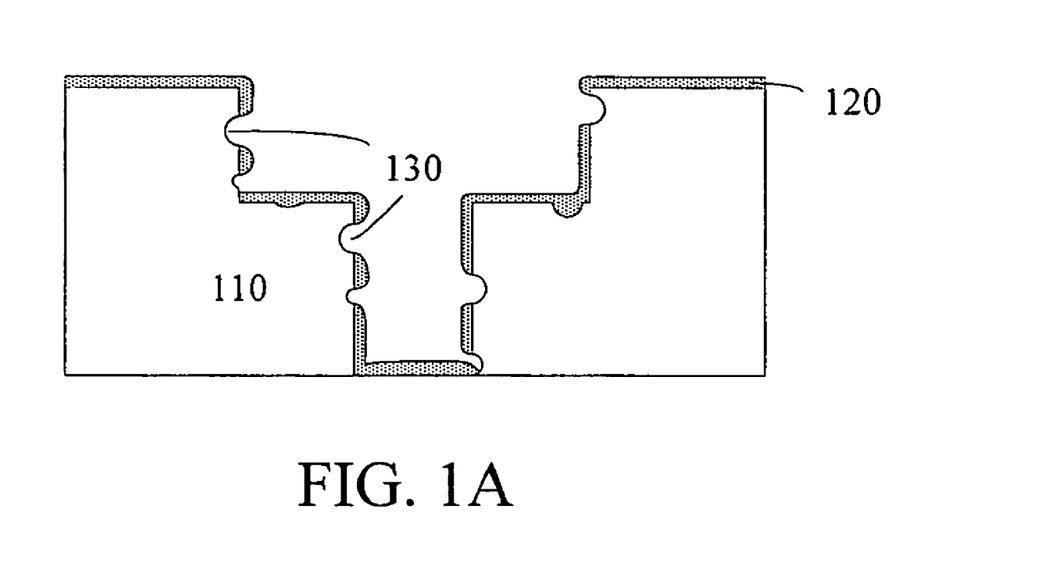
FIG. 1A is a prior art cross-sectional elevation view of a trench and via defined by a porous interlayer dielectric after a thin film has been deposited over the surface of the dielectric.
Figure 1B:
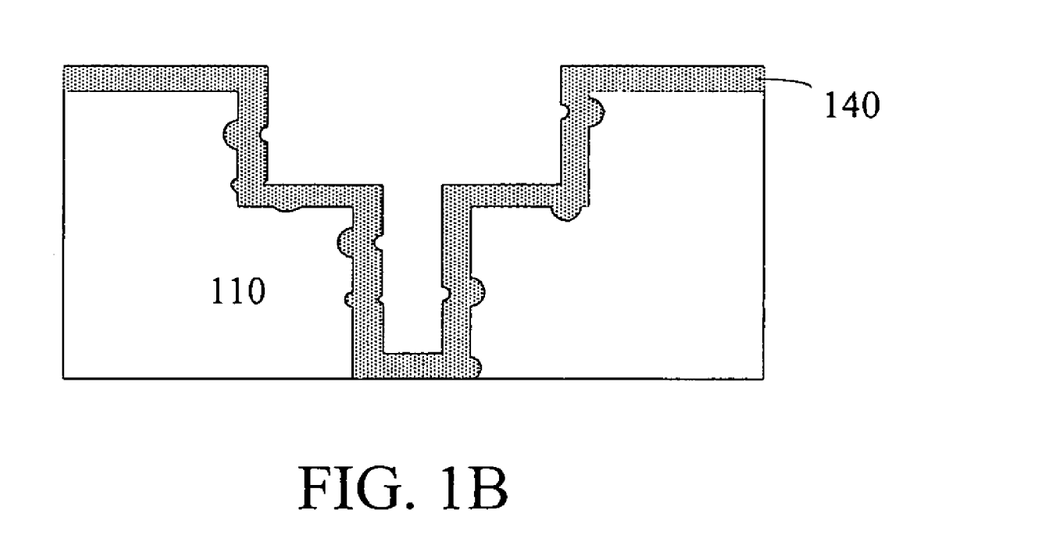
FIG. 1B is a prior art cross-sectional elevation view of a trench and via defined by a porous interlayer dielectric, after a thick barrier layer has been deposited over the surface of the dielectric.

Yet, any discontinuity, like the discontinuities 130 in FIG. 1A, in the barrier film 120 will result in the diffusion of copper atoms or penetration of plating solution into the dielectric layer 110. This diffusion can also cause copper lines to short or induce electrical leakage from line-to-line to occur, as well as cause destruction of the dielectric layer 110. As shown in FIG. 1B, the prior art requires the deposition of a thicker barrier layer 140, typically greater than 30 nm, to physically cover the exposed pores and adequately protect the dielectric layer 110. Nevertheless, this thicker barrier layer 140 takes up additional volume in a via or a trench, which increases the line resistance by reducing the volume available for copper and adding series resistance to an underlying copper connection.

These integration challenges are also present in related art methods of sealing the exposed pores on the surface of dielectric materials. One technique requires the use of thin films of material, such as SiC, to seal the pores; yet, these thin films often take too much volume and increase the dielectric constant of the interconnect structure. Another technique requires the use of plasma gas, such as nitrogen, argon, or helium, to increase the density of the dielectric surface. Nevertheless, plasma is very directional, which makes deposition of a continuous film extremely difficult. This also results in a higher dielectric constant of film stack.

DETAILED DESCRIPTION

Described herein are systems and methods of sealing a porous dielectric layer using a plasma induced surface polymerization process. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 2:
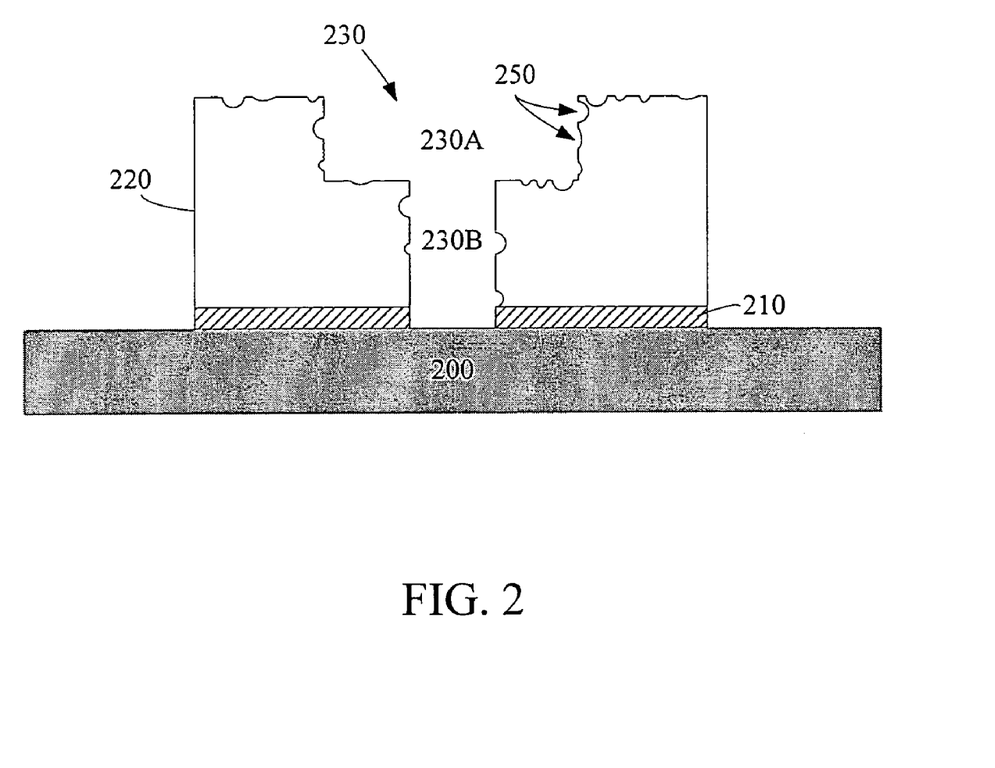
FIG. 2 is a semiconductor substrate with a patterned, porous dielectric layer.

Turning to FIG. 2, a semiconductor substrate 200 is illustrated which generally includes several active device regions (not shown), including other structures such as gates, local interconnects, metal layers, and other active or passive device structures or layers. An etch stop 210 is also illustrated in FIG. 2, which may be comprised of numerous materials. For example, etch stop 210 may be comprised of silicon nitride ($Si_3N_4$) or silicon carbide (SiC).

A porous dielectric layer 220 may be deposited on the etch stop 210 layer and patterned to produce an interconnect structure 230, for instance, a trench 230A and a via 230B. For clarity, only some of the surface pores are shown in FIG. 2. Although not illustrated, it should be noted that the entire porous dielectric layer 220 generally consists of continuous and open pores. The porous dielectric layer 220 may be deposited using conventional processes such as chemical vapor deposition (CVD), atomic layer deposition (ALD), or plasma enhanced chemical vapor deposition (PECVD). The porous dielectric layer 220 may be formed using any known suitable dielectric materials, including but not limited to oxides such as silicon dioxide ($SiO_2$) and carbon doped oxide (CDO), organic polymers such as perfluorocyclobutane (PFCB), or fluorosilicate glass (FSG). Some examples of oxide dielectrics include: LKD-5109, which may be obtained from JSR; Nanoglass-E, which may be obtained from Honeywell; and Zirkon, which may be obtained from Shipley. Some examples of polymer dielectrics are porous silk, which may be obtained from Dow Chemical and GX-3P, which may be obtained from Honeyvell. Some examples of CDOs are the BDII family from Applied Materials, and Coral from Novellus. Ordinary masking and etching processes, such as dual damascene techniques, may be used to form the interconnect structure 230, as well as any other trenches or vias needed within the dielectric layer 220.

The surface of the etched dielectric layer 220 tends to have a number of exposed pores 250, as shown in FIG. 2. This is caused in part by the porous nature of the dielectric layer 220 and tends to be exacerbated by the interconnect etching process which exposes many of the pores 250. As stated above, copper that is later formed in the interconnect structure 230, without a barrier layer, may diffuse into the dielectric layer 220 and cause the shorting of adjacent copper lines or line-to-line leakage.

Figure 3:
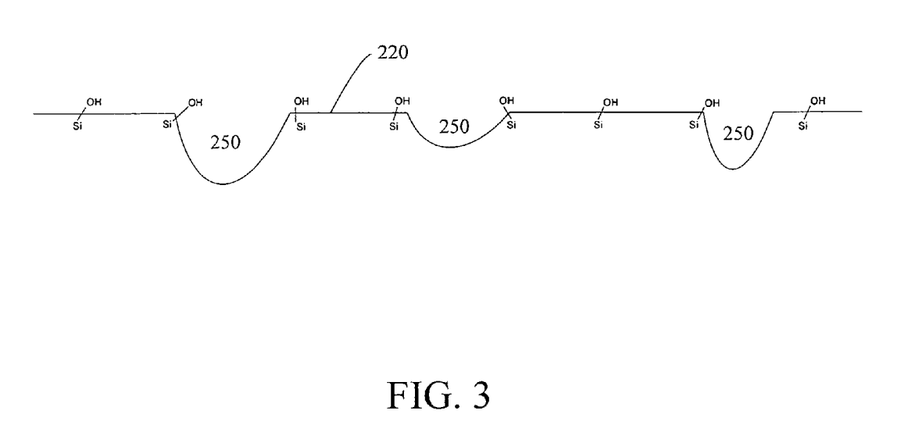
FIG. 3 is a close-up view of the surface of a dielectric layer that includes three exposed pores.

FIG. 3 is a close-up view of the surface of the dielectric layer 220 that includes three of the exposed pores 250. Silicon based porous dielectrics invariably have hydrophilic surfaces after the dual damascene patterning process, and the surface of the dielectric layer 220 contains silanol molecules (Si—OH) that typically result from the etching and cleaning processes used to form the trenches 230A and vias 230B of the interconnect structure 230. These silanol bonds are highly reactive towards silazanes, some of which are described below.

Figure 4:
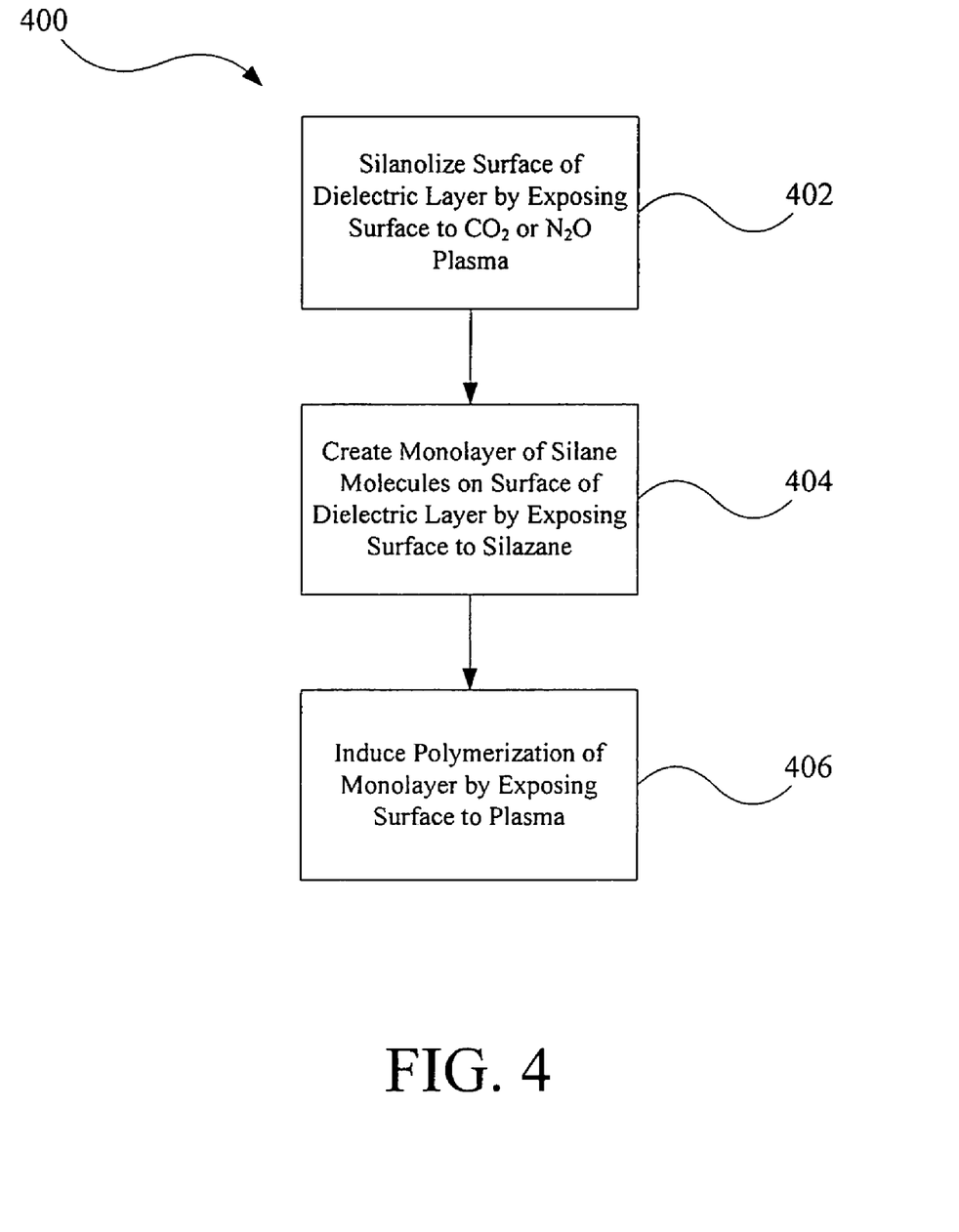
FIG. 4 is a method for sealing the exposed pores on a dielectric layer.

FIG. 4 illustrates one implementation of a pore-sealing process 400 that may be used to treat the surface of the dielectric layer 220 and seal the exposed pores 250. This reduces the likelihood of copper diffusing into the dielectric layer 220 and enables a thinner barrier layer to be used within the interconnect structure. In some implementations, the sealing of the exposed pores 250 may enable the barrier layer to be eliminated altogether.

In some implementations, the pore-sealing process 400 of the invention may begin by exposing the dielectric layer 220 to a carbon dioxide ($CO_2$) or nitrogen oxide ($N_2O$) based plasma (see 402 of FIG. 4). This process is used to silanolize the surface of the dielectric layer 220. In other words, the $CO_2$ or $N_2O$ based plasma is used to form Si—OH molecules along at least a portion of the surface of the dielectric layer 220. This step is optional and depends on whether the surface of the dielectric layer 220 was substantially silanolized by the etching and cleaning processes used to form the interconnect structure. In alternate implementations, chemicals may be used to silanolize the dielectric layer 220, such as hydrogen peroxide or other alkaline materials. Generally, the process conditions for the $CO_2$ or $N_2O$ based plasma include a pH of 11 for the alkaline chemicals and temperatures around 50° C. or higher for the peroxide based chemicals.

In an alternate implementation, a wet chemical may be used to silanolize the surface of the dielectric layer 220. In such an implementation, an oxidizing wet chemical or an ozone-based chemical may be used.

Figure 5A:
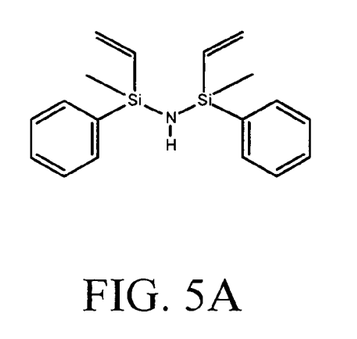
FIGS. 5A to 5D illustrate examples of unsaturated silazane molecules.
Figure 5B:
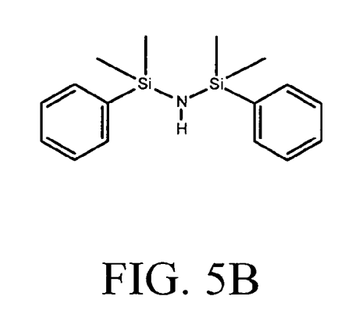
Figure 5C:
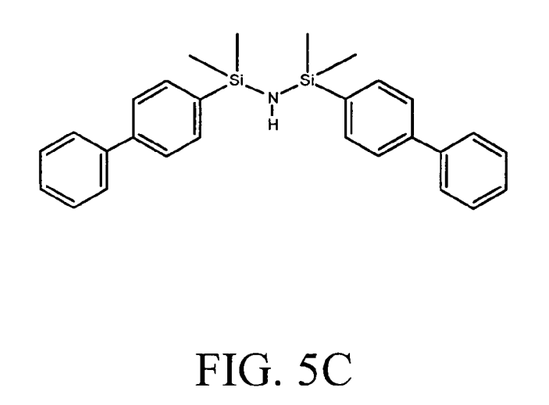
Figure 5D:
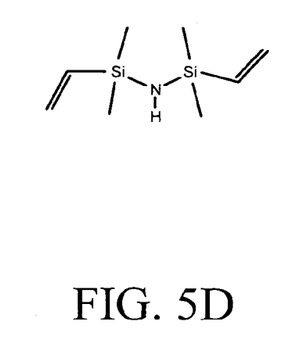

Next, the pore-sealing process 400 of the invention exposes the silanolized surface of the dielectric layer 220 to a silazane (see 404 of FIG. 4). In implementations of the invention, the silazane may be in a vapor or a liquid form either at room temperature or an elevated temperature, for instance, around 100° C. to 200° C. It is preferred that silazanes having attached polymerizable groups, such as vinyl, phenyl, or benzyl groups, be used. For instance, any of a number of unsaturated silazanes may be used, including but not limited to vinyl silazanes such as 1,3-Divinyl-1,3-Diphenyl-1,3-Dimethyldisilazane (shown in FIG. 5A), 1,3-Diphenyl-1,1,3,3,-Tetramethyldisilazane (shown in FIG. 5B), 1,3-Bis-(4-Biphenyl)-Tetramethyldisilazane (shown in FIG. 5C), and 1,3-Divinyltetramethyldisilazane (shown in FIG. 5D). Other unsaturated silazanes, including but not limited to hexamethyldisilazane (HMDS) and benzyl silazane, may be used.

Figure 6:
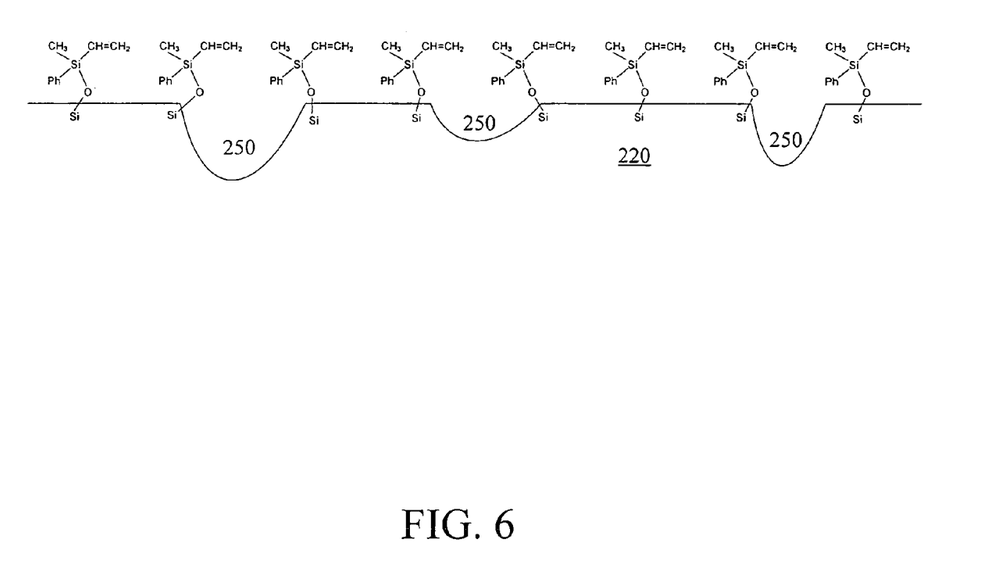
FIG. 6 is a close-up view of the surface of a dielectric layer that includes a monolayer of silane molecules.

When the silanolized surface of the dielectric layer 220 is exposed to a silazane, a physical and/or chemical adsorption of the silazane occurs at the surface of the dielectric layer 220. The adsorption process is generally highly exothermic and tends to be spontaneous and have a quick reaction rate. The physical and/or chemical adsorption of the silazane tends to be self limiting at conventional process conditions and is generally confined to a first monolayer due to the nature of the reaction. As shown in FIG. 6, the silanol molecules are replaced at the surface of the dielectric layer 220 with a monolayer of silane molecules (once the silazane molecules are adsorbed, they become silane molecules). In the implementation of FIG. 6, the pore-sealing process 400 uses vinyl silazane molecules having phenyl (Ph) side groups. It should be noted that in other implementations of the invention, the silazane used may be purely vinyl with no phenyl side groups or may be alternate silazanes as described above.

As can be seen in FIG. 6, the monolayer of silane molecules provides a dangling polymerizable species that now covers the surface of the dielectric layer 220. Accordingly, the pore-sealing process 400 of the invention induces a polymerization of the unsaturated silanes by exposing the monolayer of silane molecules to a plasma (see 406 of FIG. 4). A plasma generates radicals and positively charged ions that are ideal sources for addition to the unsaturation groups in the silane molecules. The plasma activates the unsaturated groups on the silane molecules to link among themselves and seal one or more exposed pores 250 on the surface of the dielectric layer 220. The pore sealing is surface limited and not pore-filling. As such, the dielectric constant of the porous dielectric layer 220 remains substantially unaffected.

In one implementation of the invention, the plasma used to initiate the polymerization is a diluted ethylene-based plasma that is chemically akin to the groups dangling from the surface. This cross linking of the side-groups generally results in a polyethylene type material. Furthermore, the ethylene plasma can be used along with the silane to manipulate the final dielectric wall characteristics for adhesion needs. In some implementations of the invention, the general plasma process conditions may fall into the following ranges: radio-frequency (RF) power level of 500-2000 Watts @ 13.56 MHz, ethylene ($C_2H_4$) and helium (He) flows of 200-2000 sccm, and a showerhead-electrode gap of 0.3-1.0".

Figure 7:
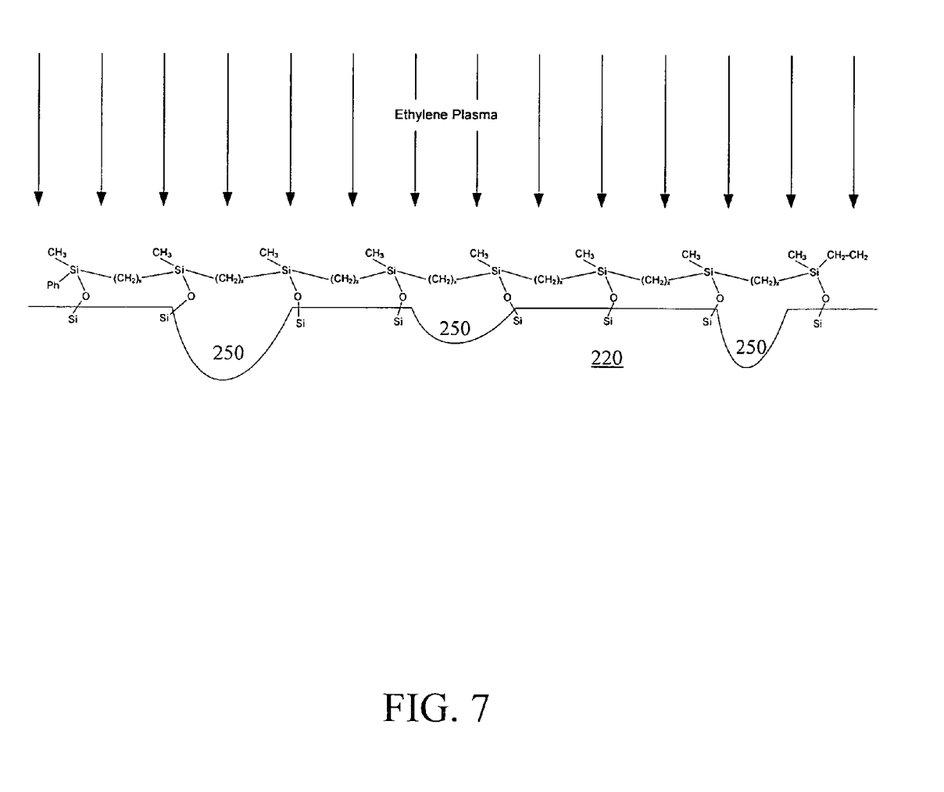
FIG. 7 is a close-up view of the surface of a dielectric layer that includes a polymerized layer of silane molecules that seals exposed pores of the surface.

For the vinyl silane implementation of FIG. 6, the ethylene plasma induces the unsaturated C═C bonds of the vinyl silane molecules to polymerize into a cross-linked matrix, as shown in FIG. 7. The phenyl side groups, if present, may become saturated and form polymer chains, denoted in FIG. 7 as $(CH_2)_x$. The cross-linked matrix may build over a substantial portion of the surface of the dielectric layer 220 and seal the exposed pores 250. The end result is the formation of a continuous, polymerized layer of carbon rich film that is cross-linked due to the unsaturation of the silane molecules prior to the plasma treatment. As stated above, the pore sealing is surface limited and not pore-filling, therefore the dielectric constant of the porous dielectric material remains substantially unaffected. The polymerized carbon rich film is generally impervious to precursors and chemicals used in subsequent barrier layer deposition processes and may increase the barrier layer's adhesion to the dielectric layer 220.

The polymerization of the monolayer may be inititated by various means, including but not limited to physical means such as thermal initiation or electron beam initiation, or chemical/radio-frequency means such as plasma initiation. In implementations of the invention, plasmas other than ethylene plasmas may be used to induce the polymerization of the unsaturated silane molecules. For instance, in other implementations, alternate plasmas that may be used include, such as a combination of argon and helium with the ethylene plasma.

Figure 8:
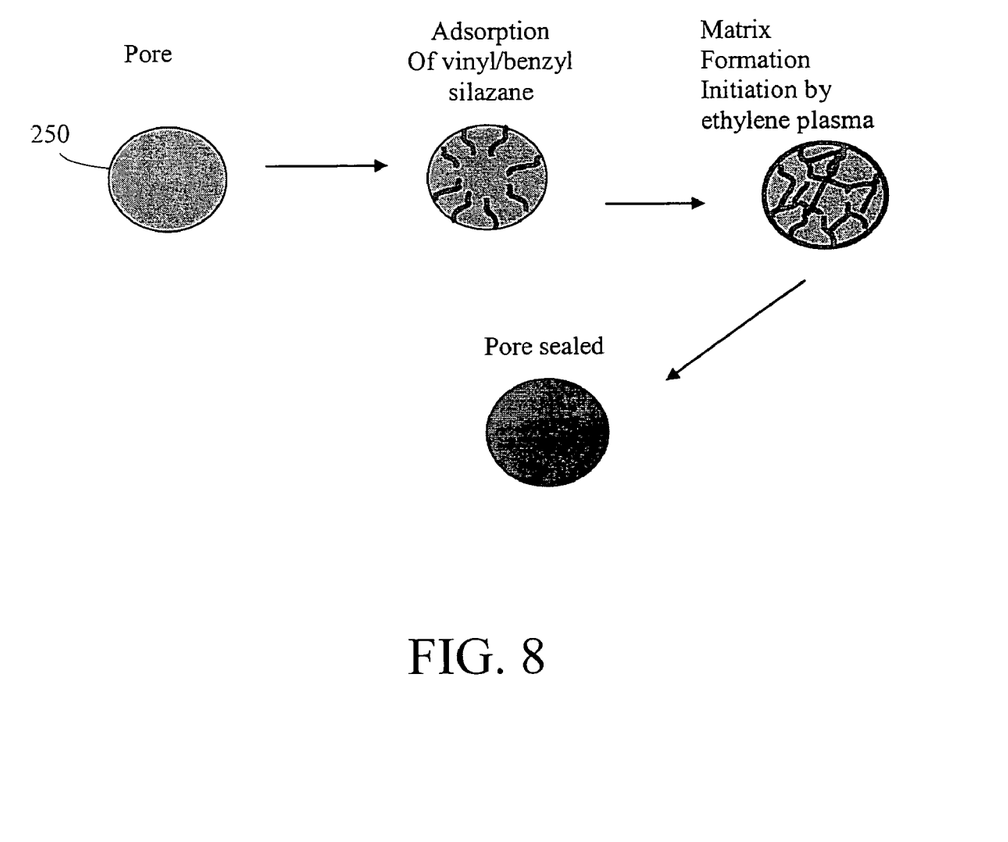
FIG. 8 is a top view of an exposed pore being sealed using a method of the invention.

FIG. 8 shows a top view of one exposed pore 250 during the plasma induced surface polymerization method of the invention. FIG. 8 begins with an exposed pore 250. Next, the dielectric layer 220 in and around the exposed pore 250 adsorbs the silazane molecules, such as unsaturated vinyl, phenyl, or benzyl silazane molecules. Then a plasma, such as ethylene plasma, is used to initiate a polymerization of the unsaturated silane molecules to form a cross-linked matrix. The polymerization process is surface driven and surface limited, and continues until it results in the formation of a solid, carbon rich layer over the surface of the dielectric layer 220.

Accordingly, a process for sealing porous dielectrics using plasma-induced surface polymerization of unsaturated silazanes has been described. The methods of the invention enable efficient pore sealing of the dielectric materials where the pore sealing is surface limited and not pore-filling. As such, the dielectric constant of the porous dielectric material remains substantially unaffected. The final surface tends to be a carbon rich layer that tends to have greater adhesion than the starting surface for subsequently deposited barrier layers.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
providing a porous dielectric layer atop a substrate, wherein the dielectric layer is patterned to form at least a trench and at least a via;
applying a first plasma to a surface of the dielectric layer to silanolize the surface;
treating the surface of the dielectric layer with a silazane to form a monolayer of silane molecules on the surface; and
applying a second plasma to the surface of the dielectric layer to induce a polymerization of at least a portion of the silane molecules.

2. The method of claim 1, wherein the porous dielectric layer comprises silicon dioxide, carbon doped oxide, an organic polymer, or fluorosilicate glass.

3. The method of claim 1, wherein the first plasma comprises a carbon dioxide plasma or a nitrogen oxide plasma.

4. The method of claim 1, wherein the silazane comprises a vinyl silazane, a phenyl silazane, a benzyl silazane, or hexamethyldisilazane.

5. The method of claim 1, wherein the silazane comprises 1,3-Divinyl-1,3-Diphenyl-1,3-Dimethyldisilazane, 1,3-Diphenyl-1,1,3,3,-Tetramethyldisilazane, 1,3-Bis-(4-Biphenyl)-Tetramethyldisilazane, or 1,3-Divinyltetramethyldisilazane.

6. The method of claim 1, wherein the second plasma comprises an ethylene-based plasma.

7. The method of claim 1, wherein the surface of the dielectric layer comprises at least one exposed pore, and the polymerized monolayer forms a cross-linked matrix that seals at least one pore on the surface of the dielectric layer.

8. The method of claim 7, wherein the silazane comprises a vinyl silazane, the second plasma comprises an ethylene plasma, and the cross-linked matrix comprises a polyethylene type layer.

9. The method of claim 1, wherein the second plasma application uses an RF power level of 500-2000W @ 13.56 MHz.

10. The method of claim 1, wherein the second plasma application uses 200-2000 sccm flows of $C_2H_4$ and He.

11. The method of claim 1, wherein the second plasma uses a showerhead-electrode gap of 0.3-1.0".

12. A method comprising:
providing a porous dielectric layer atop a substrate;
patterning the porous dielectric layer;
treating a surface of the dielectric layer with a silazane; and
treating the surface of the dielectric layer with a plasma.

13. The method of claim 12, wherein the porous dielectric layer comprises silicon dioxide, carbon doped oxide, an organic polymer, or fluorosilicate glass.

14. The method of claim 12, wherein the silazane comprises a vinyl silazane, a phenyl silazane, a benzyl silazane, or hexamethyldisilazane.

15. The method of claim 12, wherein the silazane comprises 1,3-Divinyl-1,3-Diphenyl-1,3-Dimethyldisilazane, 1,3-Diphenyl-1,1,3,3,-Tetramethyldisilazane, 1,3-Bis-(4-Biphenyl)-Tetramethyldisilazane, or 1,3-Divinyltetramethyldisilazane.

16. The method of claim 12, wherein the plasma comprises ethylene.

17. The method of claim 12, wherein the treating of the surface of the dielectric layer with a plasma forms a cross-linked matrix that seals at least one exposed pore on the surface.

18. A method comprising:
depositing a porous dielectric layer atop a substrate;
etching the porous dielectric layer to form at least a trench and at least a via;
treating the etched surface of the dielectric layer with a silazane to form at least two unsaturated silane molecules on the surface; and
applying a plasma to the at least two unsaturated silane molecules to induce the silane molecules to bond together and become saturated.

19. The method of claim 18, further comprising treating the etched surface of the dielectric layer to form at least two silanol molecules prior to treating the etched surface with the silazane.

20. The method of claim 19, wherein the treating of the etched surface of the dielectric layer comprises applying a preliminary plasma to the etched surface of the dielectric layer.

21. The method of claim 20, wherein the preliminary plasma comprises a $CO_2$ or a $N_2O$ plasma.

22. The method of claim 19, wherein the treating of the etched surface of the dielectric layer comprises applying a wet chemical to the etched surface of the dielectric layer.

23. The method of claim 22, wherein the wet chemical comprises an oxidizing wet chemical or an ozone-based chemical.

24. The method of claim 18, wherein the etching comprises a dual damascene etching process.

25. The method of claim 18, wherein the etching exposes at least one pore and the bonded silane molecules seal the exposed pore.

26. The method of claim 18, wherein the plasma comprises an ethylene plasma.

27. The method of claim 18, wherein the porous dielectric layer is deposited using CVD, ALD, or PECVD.

28. A method comprising:
   providing a porous dielectric layer atop a substrate, wherein the dielectric layer is patterned to form at least a trench and at least a via;
   applying a wet chemical to a surface of the dielectric layer to silanolize the surface;
   treating the surface of the dielectric layer with a silazane to form a monolayer of silane molecules on the surface; and
   applying a plasma to the surface of the dielectric layer to induce a polymerization of at least a portion of the silane molecules.

29. The method of claim 28, wherein the porous dielectric layer comprises silicon dioxide, carbon doped oxide, an organic polymer, or fluorosilicate glass.

30. The method of claim 28, wherein the wet chemical comprises an oxidizing wet chemical or an ozone-based chemical.

31. The method of claim 28, wherein the silazane comprises a vinyl silazane, a phenyl silazane, a benzyl silazane, or hexamethyldisilazane.

32. The method of claim 28, wherein the silazane comprises 1,3-Divinyl-1,3-Diphenyl-1,3-Dimethyldisilazane, 1,3-Diphenyl-1,1,3,3,-Tetramethyldisilazane, 1,3-Bis-(4-Biphenyl)-Tetramethyldisilazane, or 1,3-Divinyltetramethyldisilazane.

33. The method of claim 28, wherein the plasma comprises an ethylene-based plasma.

\* \* \* \* \*